United States Patent
Chen et al.

(10) Patent No.: US 9,018,691 B2
(45) Date of Patent: Apr. 28, 2015

(54) NONVOLATILE MEMORY STRUCTURE AND FABRICATION METHOD THEREOF

(71) Applicant: eMemory Technology Inc., Hsin-Chu (TW)

(72) Inventors: Wei-Ren Chen, Pingtung County (TW); Te-Hsun Hsu, Hsinchu County (TW); Chih-Hsin Chen, Changhua County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/943,805

(22) Filed: Jul. 17, 2013

(65) Prior Publication Data

US 2014/0183612 A1    Jul. 3, 2014

Related U.S. Application Data

(60) Provisional application No. 61/746,124, filed on Dec. 27, 2012.

(51) Int. Cl.
| | |
|---|---|
| *H01L 27/115* | (2006.01) |
| *H01L 29/66* | (2006.01) |
| *H01L 29/423* | (2006.01) |
| *H01L 29/788* | (2006.01) |
| *G11C 16/04* | (2006.01) |

(52) U.S. Cl.
CPC .... *H01L 29/66825* (2013.01); *H01L 27/11524* (2013.01); *H01L 27/11558* (2013.01); *H01L 29/42328* (2013.01); *H01L 29/7881* (2013.01); *G11C 16/0425* (2013.01)

(58) Field of Classification Search
CPC . H01L 21/28; H01L 29/401; H01L 29/66825; H01L 29/788; H01L 21/28273; H01L 29/7883; H01L 29/42324; H01L 27/11524; H01L 29/42328; H01L 29/7881; H01L 27/11558; G11C 16/0425; G11C 16/0433; G11C 16/10; G11C 16/344; G11C 16/3445; G11C 16/3454; G11C 16/3459; G11C 16/16; G11C 2216/22

See application file for complete search history.

(56) References Cited

U.S. PATENT DOCUMENTS

| | | | | |
|---|---|---|---|---|
| 6,160,289 | A  * | 12/2000 | Kwon et al. | 257/335 |
| 6,274,898 | B1 * | 8/2001  | Mehta et al. | 257/298 |
| 7,442,976 | B2 * | 10/2008 | Juengling | 257/296 |
| 7,633,810 | B2 * | 12/2009 | Fang et al. | 365/185.26 |
| 8,013,395 | B2 * | 9/2011  | Kotani | 257/368 |
| 2002/0158282 | A1 * | 10/2002 | Li et al. | 257/297 |
| 2005/0194647 | A1  | 9/2005 | Tsai | |

(Continued)

*Primary Examiner* — Jarrett Stark
*Assistant Examiner* — Bitew Dinke
(74) *Attorney, Agent, or Firm* — Winston Hsu; Scott Margo

(57) ABSTRACT

A nonvolatile memory structure includes a semiconductor substrate having thereon a first oxide define (OD) region, a second OD region and a third OD region arranged in a row. The first, second, and third OD regions are separated from one another by an isolation region. The isolation region includes a first intervening isolation region between the first OD region and the second OD region, and a second intervening isolation region between the second OD region and the third OD region. A select gate transistor is formed on the first OD region. A floating gate transistor is formed on the second OD region. The floating gate transistor is serially coupled to the select gate transistor. The floating gate transistor includes a floating gate that is completely overlapped with the underlying second OD region and is partially overlapped with the first and second intervening isolation regions.

27 Claims, 26 Drawing Sheets

(56) References Cited

U.S. PATENT DOCUMENTS

| | | | |
|---|---|---|---|
| 2005/0195636 A1* | 9/2005 | Umezawa et al. | 365/149 |
| 2005/0258461 A1* | 11/2005 | Wang et al. | 257/288 |
| 2006/0001050 A1* | 1/2006 | Wang et al. | 257/213 |
| 2006/0138463 A1* | 6/2006 | Kim et al. | 257/202 |
| 2007/0012989 A1* | 1/2007 | Yoshikawa | 257/315 |
| 2007/0120175 A1* | 5/2007 | Tanaka | 257/315 |
| 2007/0132033 A1* | 6/2007 | Wu et al. | 257/371 |
| 2007/0164347 A1* | 7/2007 | Kim | 257/315 |
| 2008/0153225 A1* | 6/2008 | Fang et al. | 438/258 |
| 2008/0160672 A1 | 7/2008 | Hong | |
| 2009/0278208 A1* | 11/2009 | Chang | 257/392 |
| 2009/0290437 A1 | 11/2009 | Chen | |
| 2010/0157679 A1* | 6/2010 | Sommer | 365/185.18 |
| 2010/0157690 A1 | 6/2010 | Jung | |
| 2012/0280305 A1* | 11/2012 | Zhu et al. | 257/324 |
| 2013/0092995 A1* | 4/2013 | Choi | 257/315 |
| 2013/0113030 A1* | 5/2013 | Taniguchi | 257/315 |
| 2013/0307044 A1* | 11/2013 | Kinoshita et al. | 257/314 |
| 2014/0282310 A1* | 9/2014 | Lee et al. | 716/102 |

* cited by examiner

| Mode | SL | SG | BL | PW |
|------|----|----|----|----|
| READ | 0V | 1~6V | 1~6V | 0V |
| PGM | 0V | 2~6V | 5~12V | 0V |
| ERS | UV light | | | |

FIG. 3B

| Mode | SL/NW | SG | BL | P-Sub |
|---|---|---|---|---|
| READ | 1~3V | 0V | 0.3~1V | 0V |
| READ | 0V | -1~5V | -0.3~-3V | 0V |
| PGM | 3~9V | 0V | 0V | 0V |
| PGM | 0V | -1~5V | -3~-9V | 0V |
| ERS | UV light | | | |

FIG. 5B

| Mode | SL/(NW/DNW) | SG | BL | PW | CL |
|---|---|---|---|---|---|
| PGM(CHE) | 0V/VPP | VDD2 | VPP | 0V | VDD2 |
| PGM(FN) | 0V | 0V | 0V | 0V | VFN |
| ERS | UV light | | | | |

FIG. 6C

NONVOLATILE MEMORY STRUCTURE AND FABRICATION METHOD THEREOF

CROSS REFERENCE TO RELATED APPLICATIONS

This application claims the benefit of U.S. provisional application No. 61/746,124 filed Dec. 27, 2012.

BACKGROUND OF THE INVENTION

1. Field of the Invention

The present invention relates generally to the filed of non-volatile memory devices. More particularly, the present invention relates to a nonvolatile memory structure with improved data retention.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory. MTP is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required. Therefore, the electric circuits for OTP are much simpler than those for the MTP to minimize the production procedures and cost.

MTP memory units and OTP memory units share similar stacking structures. Structurally speaking, current floating gate NVMs are divided into double-poly non-volatile memory and single-poly non-volatile memory. In the double-poly non-volatile memory, it usually comprises a floating gate for the storage of charges, an insulation layer (an ONO composite layer of silicon oxide/silicon nitride/silicon oxide for example), and a control gate for controlling the access of data. The operation of the memory unit is based on the principle of electric capacity, i.e. induced charges are stored in the floating gate to change the threshold voltage of the memory unit for determining the data status of "0" and "1." Because the single-poly non-volatile memory is compatible with regular CMOS process, it is usually applied in the field of embedded memory, embedded non-volatile memory in the mixed-mode circuits and micro-controllers (such as System on Chip, SOC) for example.

For advance node consideration, as dimensions and tunneling oxide of the memory cell unit continue to shrink, the data retention loss or charge leakage from the floating gate looms as an increasingly serious problem. Therefore, there is a strong need in this industry to improve the data retention characteristics of the nonvolatile memory.

SUMMARY OF THE INVENTION

It is one objective of the invention to provide an improved nonvolatile memory structure with improved data retention, which is also compatible with the standard logic CMOS processes.

It is another objective of the invention to provide an improved nonvolatile memory structure having an ultrathin gate dielectric layer, which is especially applied to the sub-micron process technology.

According to one aspect of the invention, a nonvolatile memory structure is provided, which includes a semiconductor substrate of a first conductivity type having thereon a first oxide define (OD) region, a second OD region and a third OD region arranged in a row along a first direction. The first, second, and third OD regions are separated from one another by an isolation region. The isolation region includes a first intervening isolation region between the first OD region and the second OD region, and a second intervening isolation region between the second OD region and the third OD region. A select gate transistor is formed on the first OD region. The select gate transistor includes a select gate extending along a second direction. A floating gate transistor is formed on the second OD region. The floating gate transistor is serially coupled to the select gate transistor. The floating gate transistor includes a floating gate that is completely overlapped with the underlying second OD region and is partially overlapped with the first and second intervening isolation regions.

The select gate transistor further comprises a source region of a second conductivity type in an ion well of a third conductivity type, an drain region of the second conductivity type spaced apart from the source region, a channel region between the source region and the drain region, the select gate overlying the channel region, and a gate dielectric layer between the select gate and the channel region.

From another aspect of the invention, a nonvolatile memory structure includes a semiconductor substrate of a first conductivity type having thereon a first OD region, a second OD region, a third OD region, a fourth OD region and a fifth OD region, wherein the first OD region, the second OD region, and the third OD region are arranged in a row along a first direction, while the second OD region, the fourth OD region, and the fifth OD region are arranged in a column along a second direction, wherein the first, second, and third OD regions are separated from one another by an isolation region, and wherein the isolation region comprises a first intervening isolation region between the first OD region and the second OD region, a second intervening isolation region between the second OD region and the third OD region, a third intervening isolation region between the second OD region and the fourth OD region, and a fourth intervening isolation region between the fourth OD region and the fifth OD region.

A select gate transistor is formed on the first OD region. The select gate transistor comprises a select gate extending along the second direction. A floating gate transistor is formed on the second OD region. The floating gate transistor is serially coupled to the select gate transistor. The floating gate transistor comprises a floating gate that is completely overlapped with the underlying second OD region, the fourth OD region and the third intervening isolation region, and is partially overlapped with the first and second intervening isolation regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 3A and 3B illustrate the equivalent circuit and exemplary conditions for programming (PGM), reading (READ) or erasing (ERS) operations of the memory cell unit as set forth in FIG. 2A and FIG. 2B;

FIGS. 5A and 5B illustrate the equivalent circuit and exemplary conditions for programming (PGM), reading (READ) or erasing (ERS) operations of the memory cell unit as set forth in FIG. 4;

FIGS. 6A, 6B and 6C demonstrate the equivalent circuits and exemplary conditions for programming (PGM), reading (READ) or erasing (ERS) operations of a double poly memory cell unit in accordance with still another embodiment of this invention;

Figure 1A:
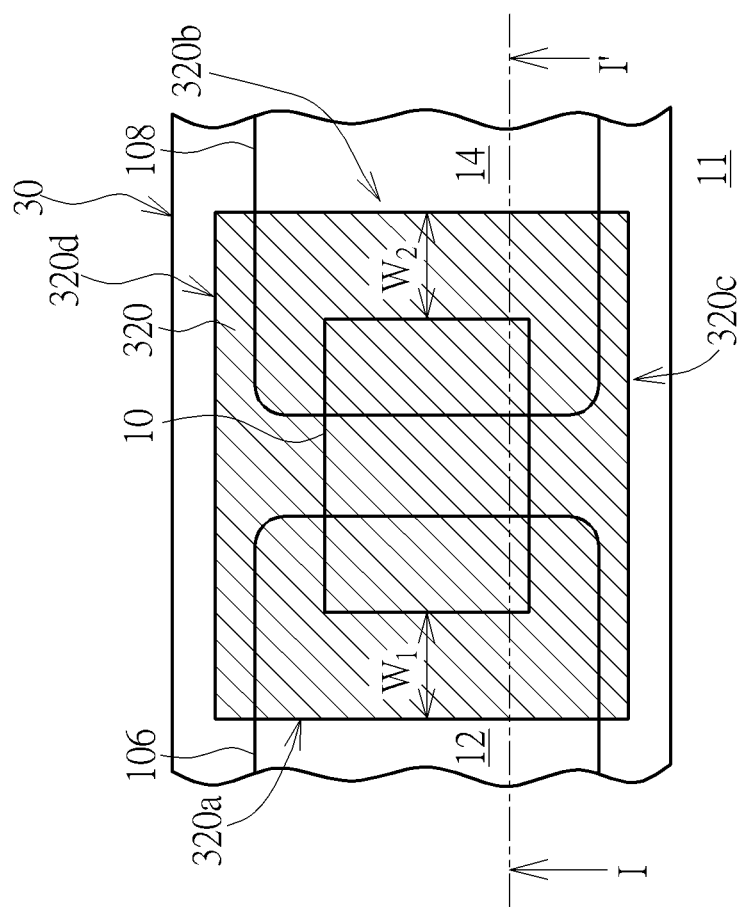
FIG. 1A is a schematic plan view of a layout of a single-poly floating gate transistor in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 1B:
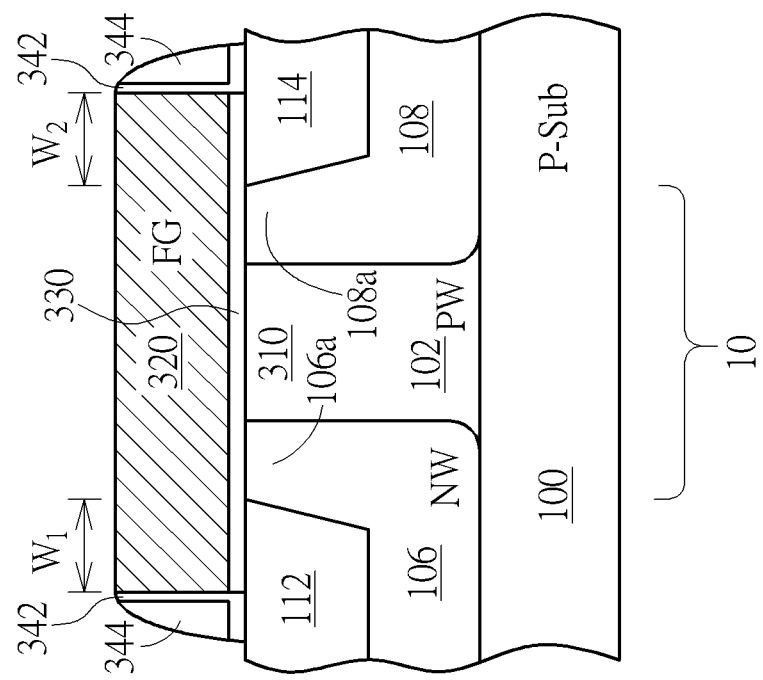
FIG. 1B is a schematic, cross-sectional diagram taken along line I-I' of FIG. 1.

FIG. 1A and FIG. 1B are schematic diagrams demonstrating a single-poly storage node for nonvolatile memory in accordance with one embodiment of this invention. As shown in FIG. 1A and FIG. 1B, a floating gate transistor 30 is formed directly on an oxide define (OD) region 10. The OD region 10 is encompassed by the isolation regions 12 and 14. The floating gate transistor 30 comprises a floating gate (FG) 320 overlying the OD region 10 and a floating gate dielectric layer 330 between the floating gate 320 and the OD region 10. The floating gate 320 may be a single layer of polysilicon or doped polysilicon. For example, the floating gate 320 may have a rectangular shape and may have four side edges 320a, 320b, 320c, and 320d. It is to be understood that the shape of the floating gate is only for illustration purposes and is not intended to limit the scope of the invention. A sidewall spacer 344 and a liner layer 342 may be formed along the four side edges 320a, 320b, 320c, and 320d. According to the embodiment, the floating gate 320 is completely overlapped with the underlying OD region 10 and is partially overlapped with the isolation regions 12 and 14.

According to the embodiment, the floating gate 320 laterally extends to the isolation regions 12 and 14 such that the two opposite side edges 320a and 320b of the floating gate 320 are situated directly on the isolation regions 12 and 14, respectively. The dimensions w1 and w2 of the overlapping regions between the floating gate 320 and the isolation regions 12 and 14 are adjustable and may be optimized. According to the embodiment, the dimensions w1 and w2 are greater than zero and may range between 0.005 um and 100 um. Further, the dimension w1 may be equal to or not equal to the dimension w2.

A first N type region 106 partially overlaps with the floating gate 320 in the OD region 10. The overlapping region between the first N type region 106 and the floating gate 320 is denoted as region 106a. A second N type region 108 is formed in the semiconductor substrate 100 to encompass the isolation region 14. The overlapping region between the second N type region 108 and the floating gate 320 is denoted as region 108a. The first N type region 106 and the second N type region 108 may be formed within a P type region 102. According to the embodiment, a floating gate channel 310 may be defined between the overlapping regions 106a and 108a.

Figure 10:
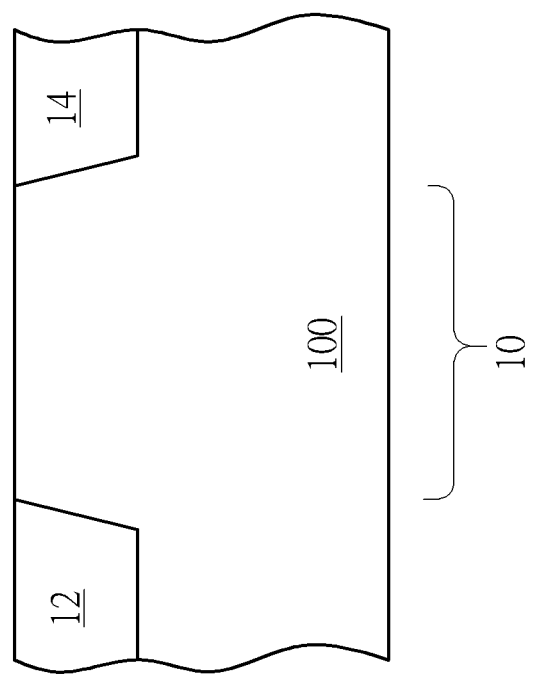
FIGS. 10~13 are schematic diagrams showing an exemplary method for forming a memory cell according to the invention.
Figure 11:
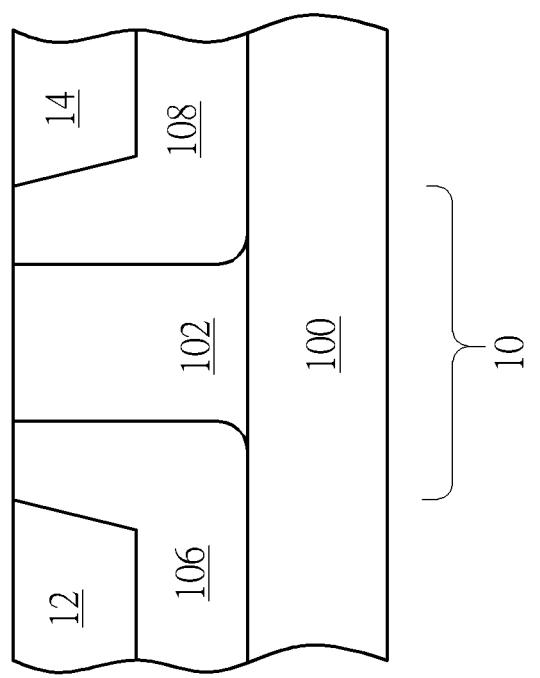
Figure 12:
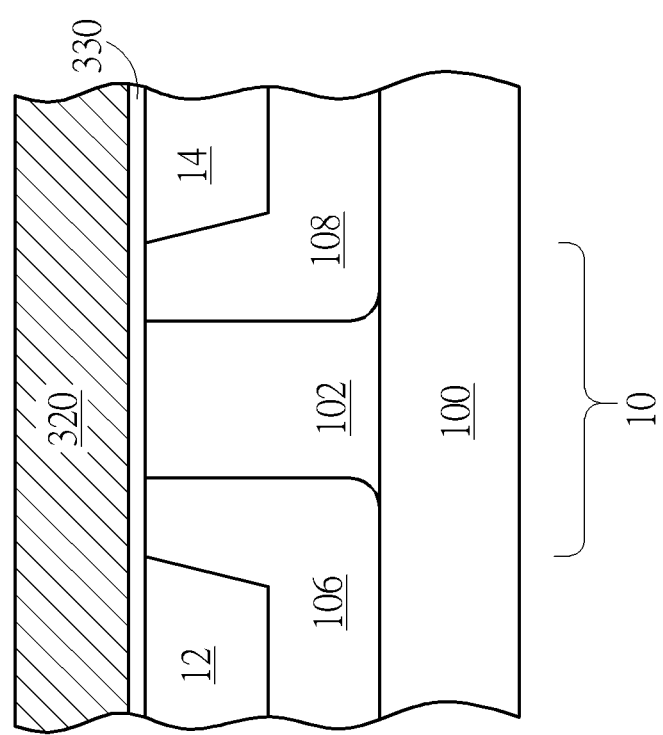
Figure 13:
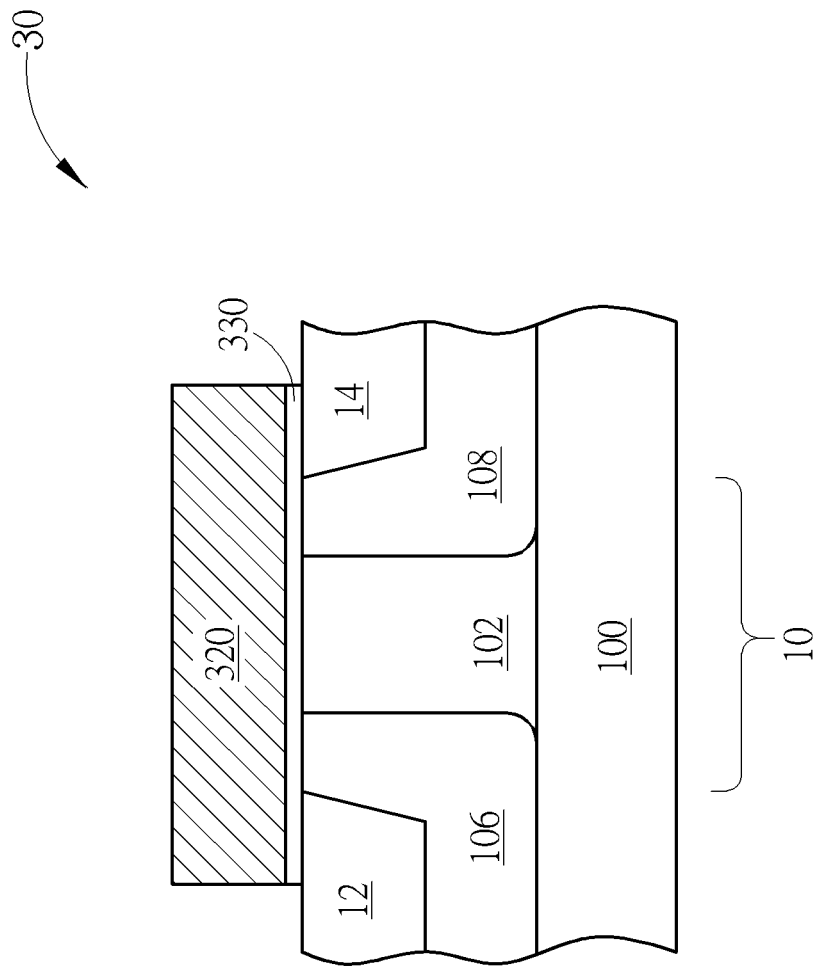

FIGS. 10~13 are schematic diagrams showing an exemplary method for forming a nonvolatile memory according to the invention. As shown in FIG. 10, an oxide define (OD) region 10 is formed in a semiconductor substrate 100. The oxide define region 10 is encompassed by at least a first isolation region 12 and a second isolation 14. As shown in FIG. 11, a first doping region 102 is formed in the semiconductor substrate 100. A second doping region 106 is then formed in the first doping region 102. The second doping region 106 partially overlaps with the oxide define region 10. The second doping region 106 encompasses the first isolation region 12. A third doping region 108 is formed in the first doping region 102. The third doping region 108 partially overlaps with the oxide define region 10. The third doping region 108 encompasses the second isolation region 14. As shown in FIG. 12, a gate dielectric layer 330 is deposited on the oxide define region 10. The thickness of the gate dielectric layer 330 is less than 70 nm but not limited to which results in that the nonvolatile memory is especially applied to the sub-micron process technology. A gate material layer 320 is deposited on the gate dielectric layer 330. As shown in FIG. 13, the gate material layer 320 is etched to form a gate pattern wherein the gate pattern has one edge situated directly on the first isolation region 12 and an opposite second edge situated directly on the second isolation region 14. In other words, the gate pattern has edges located on the isolation regions and apart from the oxide define region. Further, the gate material layer comprises polysilicon.

According to one embodiment, the semiconductor substrate 100 and the first doping region 102 are both P type. The second and third doping regions are both N type.

According to another embodiment, the method may further comprise forming a deep doping region (for example a deep N well region) underneath the first doping region 102. In this case, the semiconductor substrate 100 is P type and the first doping region 102 is N type. The second and third doping regions are both P type.

Figure 2A:
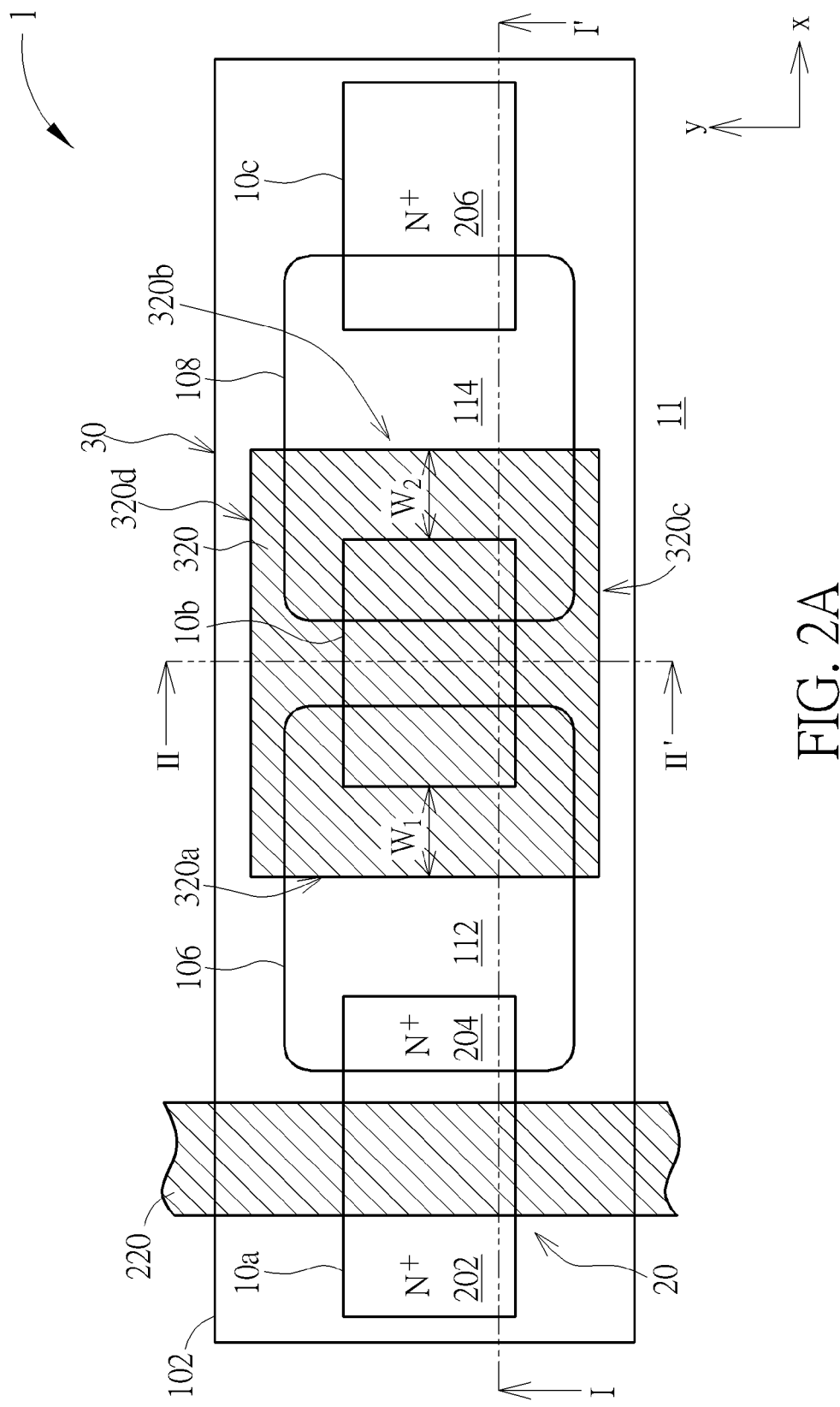
FIG. 2A is a plan view of a layout of a single-poly, nonvolatile memory cell unit in accordance with one embodiment of this invention.
Figure 2B:
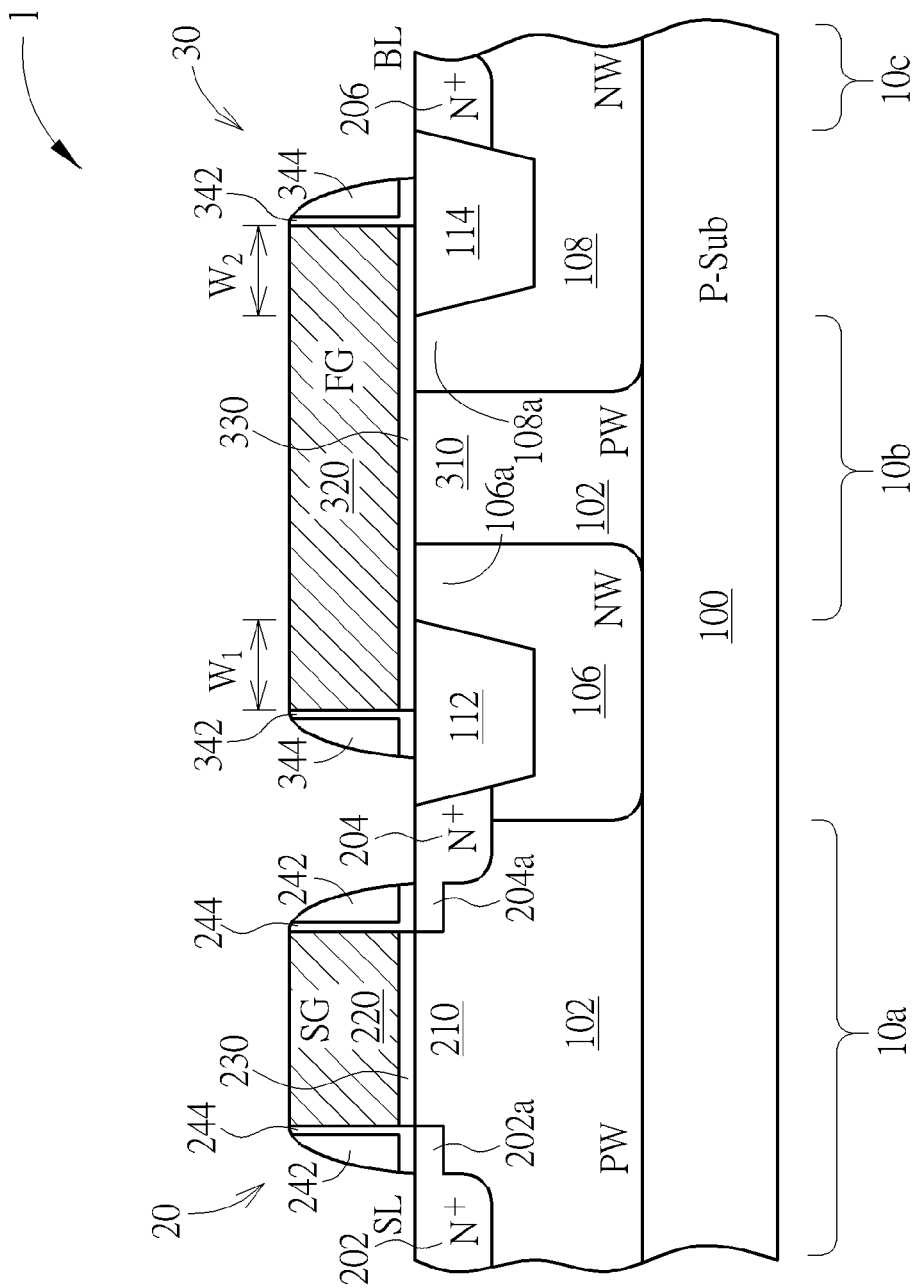
FIG. 2B is a schematic, cross-sectional diagram taken along line I-I' of FIG. 1.
Figure 2C:
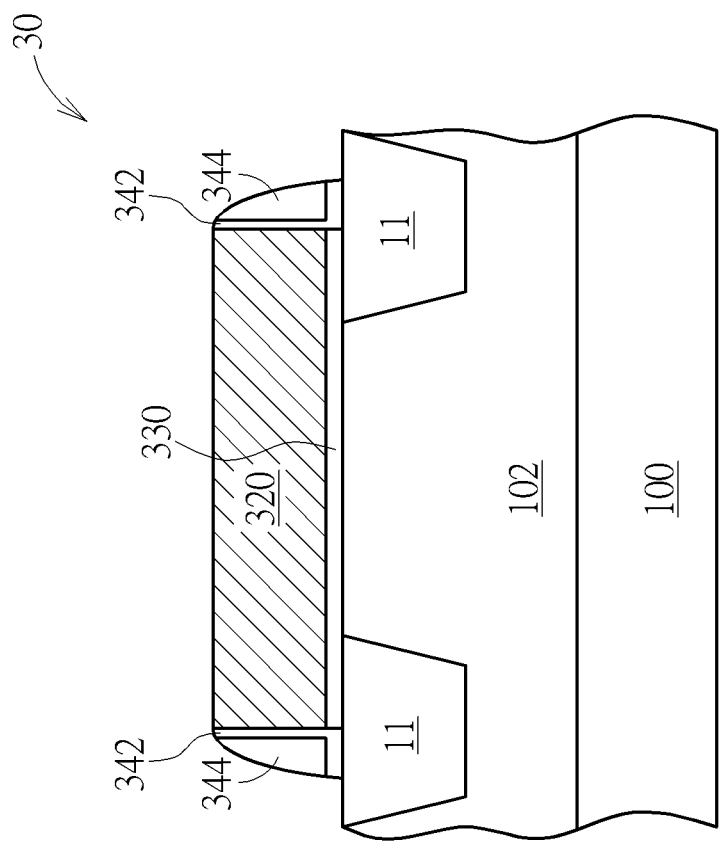
FIG. 2C is a schematic, cross-sectional diagram taken along line II-IF of FIG. 1.

FIGS. 2A-2C are schematic diagrams demonstrating a single-poly, nonvolatile memory cell unit in accordance with one embodiment of this invention. As shown in FIG. 2A, the nonvolatile memory cell unit 1 comprises three spaced-apart oxide define (OD) regions arranged and aligned in a row along the first direction (reference x axis). The three spaced-apart OD regions are first OD region 10a, second OD region 10b, and third OD region 10c, which are defined by an isolation region 11 embedded in a main surface of a semiconductor substrate 100 such as a P type doped silicon substrate. The second OD region 10b is situated between the first OD region 10a and third OD region 10c.

According to the embodiment, the isolation region 11 may be a shallow trench isolation (STI) region, but should not be limited thereto. According to the embodiment, the isolation region 11 may be fabricated concurrently with the logic circuit elements such as PMOS or NMOS transistors in the logic circuits. However, it is to be understood that the isolation region 11 can be fabricated separately from the logic circuit elements in some cases.

As shown in FIG. 2A and FIG. 2B, according to the embodiment, the isolation region 11 includes a first intervening isolation region 112, which is interposed between the first OD region 10a and the second OD region 10b, and a second intervening isolation region 114, which is interposed between the second OD region 10b and the third OD region 10c.

A select gate transistor 20 may be formed directly on the first OD region 10a. According to the embodiment, the select gate transistor 20 is an NMOS and comprises an N+ source region 202 (connected to a source line SL) in a P type region 102 (for example, a P well: PW), an N+ drain region 204 spaced apart from the N+ source region 202, a channel region 210 near the main surface of the semiconductor substrate 100 between the N+ source region 202 and the N+ drain region 204, a select gate (SG) 220 overlying the channel region 210, and a gate dielectric layer 230 between the select gate 220 and the channel region 210. A pair of sidewall spacers 242 such as silicon nitride spacers may be provided on opposite sidewalls of the select gate 220. A liner layer 244 such as silicon oxide liner may be interposed between the sidewall spacer 242 and the sidewall of the select gate 220. Further, lightly doped drain (LDD) regions 202a and 204a may be provided in the P type region 102 and directly under the sidewall spacers 242. As can be best seen in FIG. 2A, the straight line-shaped select gate extends along the second direction (reference y axis).

Still referring to FIG. 2A and FIG. 2B, a floating gate transistor 30 is formed directly on the second OD region 10b. The floating gate transistor 30 is coupled to the select gate transistor 20 through the N+ drain region 204. That is, the N+ drain region 204 is commonly shared by the floating gate transistor 30 and the select gate transistor 20, thereby forming two serially connected transistors, and in this case, two serially connected NMOS transistors. The floating gate transistor 30 comprises a floating gate (FG) 320 overlying the second OD region 10b. For example, the floating gate 320 may have a rectangular shape and may have four side edges 320a, 320b, 320c, and 320d. It is to be understood that the shape of the floating gate is only for illustration purposes. A sidewall spacer 344 and a liner layer 342 may be formed along the four side edges 320a, 320b, 320c, and 320d. According to the embodiment, the floating gate 320 is completely overlapped with the underlying second OD region 10b and is partially overlapped with the first and second intervening isolation regions 112 and 114. Preferably, the floating gate 320 laterally extends to the first and second intervening isolation regions 112 and 114 such that the two opposite side edges 320a and 320b of the floating gate 320 are situated directly on the first and second intervening isolation regions 112 and 114, respectively. The dimensions w1 and w2 of the overlapping regions between the floating gate 320 and the first and second intervening isolation regions 112 and 114 are adjustable and may be optimized. According to the embodiment, the dimensions w1 and w2 are greater than zero and may range between 0.005 um and 100 um. Further, the dimension w1 may be equal to or not equal to the dimension w2.

It is one germane feature of the invention that the entire perimeter of the floating gate 320 is located directly on the isolation region 11, and more importantly, the two opposite side edges 320a and 320b of the floating gate 320 are situated directly on the first and second intervening isolation regions 112 and 114, respectively. By doing this, the data retention loss or current leakage from the floating gate can be greatly reduced.

As shown in FIG. 2B, a first N type region 106 (for example, an N well: NW) is formed in the semiconductor substrate 100. The first N type region 106 encompasses the first intervening isolation region 112. The floating gate transistor 30 is coupled to the N+ drain region 204 of the select gate transistor 20 through the first N type region 106 that partially overlaps with the floating gate 320 in the second OD region 10b and partially overlaps with the N+ drain region 204 in the first OD region 10a. The overlapping region between the first N type region 106 and the floating gate 320 is denoted as region 106a. Likewise, a second N type region 108 is formed in the semiconductor substrate 100 to encompass the second intervening isolation region 114. The floating gate transistor 30 is coupled to an N+ drain region 206 in the third OD region 10c through the second N type region 108 that partially overlaps with the floating gate 320 in the second OD region 10b and partially overlaps with the N+ drain region 206 in the third OD region 10c. The overlapping region between the second N type region 108 and the floating gate 320 is denoted as region 108a. According to the embodiment, the N+ drain region 206 is electrically coupled to a bit line (BL, not explicitly shown). A floating gate channel 310 may be defined between the overlapping regions 106a and 108a.

As shown in FIG. 2A and FIG. 2C, the other two opposite side edges 320c and 320d are also situated directly on the isolation region 11 that surrounds the second OD region 10b. It is noteworthy that since the floating gate 320 laterally extends onto the first and second intervening isolation regions 112 and 114, no N+ doping regions or LDD regions is formed in the P type region 102 directly under the floating gate 320. It is advantageous to use the present invention because the data retention characteristics can be improved by avoiding the overlapping between the two opposite side edges 320a and 320b with any oxide define region of the memory cell unit.

Figure 3A:
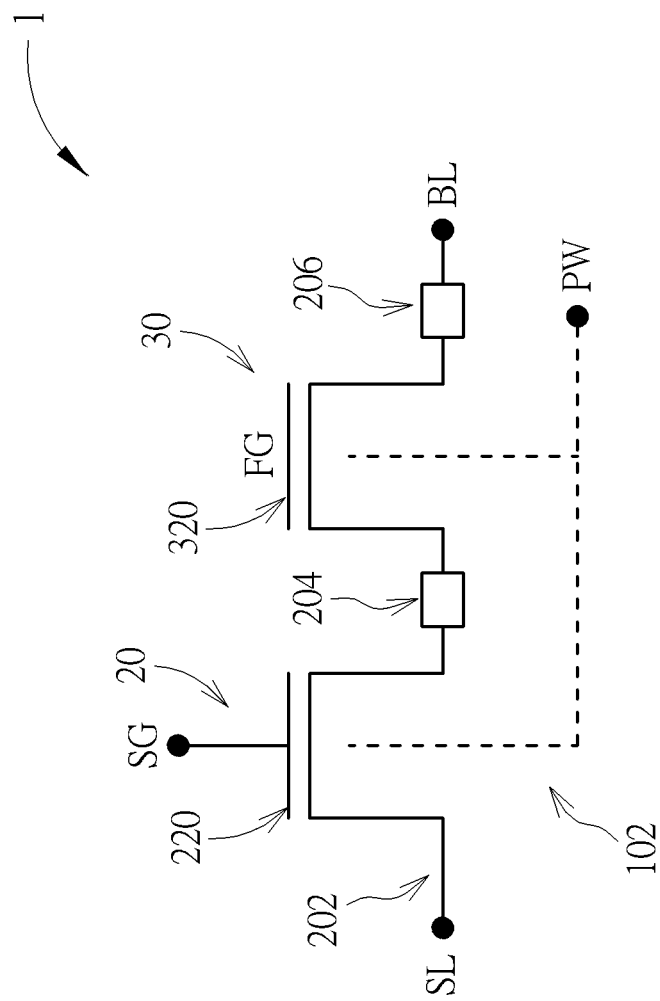

FIGS. 3A and 3B illustrate the equivalent circuit and exemplary operating conditions for programming (PGM), reading (READ) or erasing (ERS) operations of the memory cell unit as set forth in FIG. 2A and FIG. 2B. As shown in FIGS. 3A and 3B, during PGM operation, the P type region 102, and the source line (SL) coupled to the N+ source region 202 are both grounded, the select gate (SG) 220 is applied with a select gate voltage ranging between 2~6V, the bit line (BL) coupled to the N+ drain region 206 in the third OD region 10c is applied with a bit line voltage ranging between 5~12V. During READ operation, the P type region 102, and the source line (SL) coupled to the N+ source region 202 are both grounded, the select gate (SG) 220 is applied with a select gate voltage ranging between 1~6V, the bit line (BL) coupled to the N+ drain region 206 in the third OD region 10c is applied with a bit line voltage ranging between 1~6V. Moreover, the data written into the memory cell unit can be erased by UV irradiation.

Figure 4:
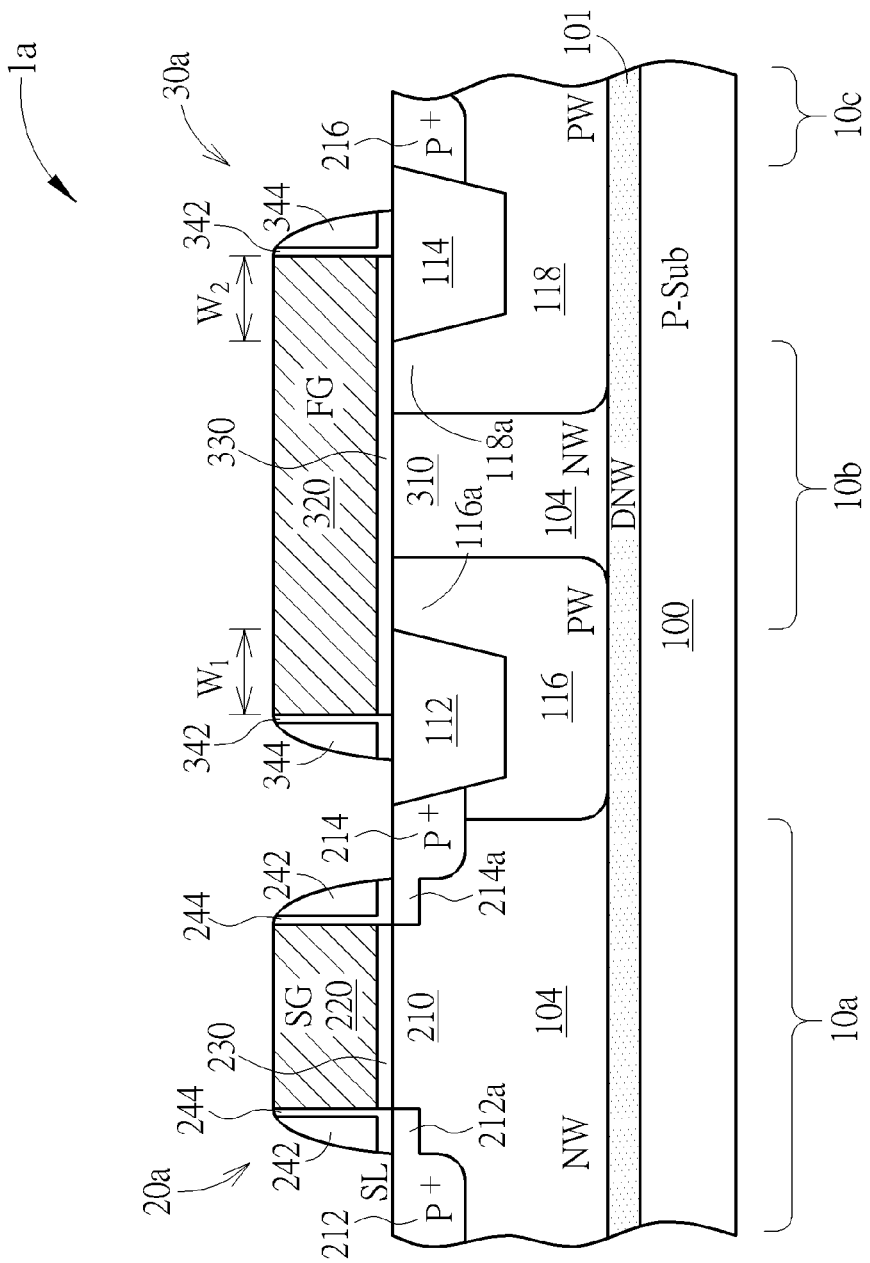
FIG. 4 is a schematic, cross-sectional diagram showing a single-poly, nonvolatile memory cell unit in accordance with another embodiment of this invention.

FIG. 4 is a schematic, cross-sectional diagram showing a single-poly, nonvolatile memory cell unit in accordance with another embodiment of this invention. As shown in FIG. 4, the nonvolatile memory cell unit 1a comprises a PMOS select gate transistor 20a, which is fabricated on a first OD region 10a and has substantially identical structure as set forth in FIG. 2A (memory cell units 1 and 1a have substantially the same layout). The select gate transistor 20a comprises a P+ source region 212 and a spaced apart P+ drain region 214 in the N type region 104. A deep N type region (DNW) 101 is provided in the P type semiconductor 100 to isolate the P type regions 116 and 118. Likewise, LDD regions 212a and 214a are provided under the select gate 220 to define a channel 210 therebetween in the N type region 104. A floating gate transistor 30a is coupled to the P+ drain region 204a through the P type region 116 encompassing the intervening isolation region 112. Likewise, the two opposite side edges 320a and 320b of the floating gate 320 are situated directly on the intervening isolation regions 112 and 114 respectively. A floating gate channel 310 may be defined between the overlapping regions 116a and 118a. The floating gate transistor 30a is coupled to the P+ drain region 216 and bit line (BL) through the P type region 118 encompassing the intervening isolation region 114.

Figure 5A:
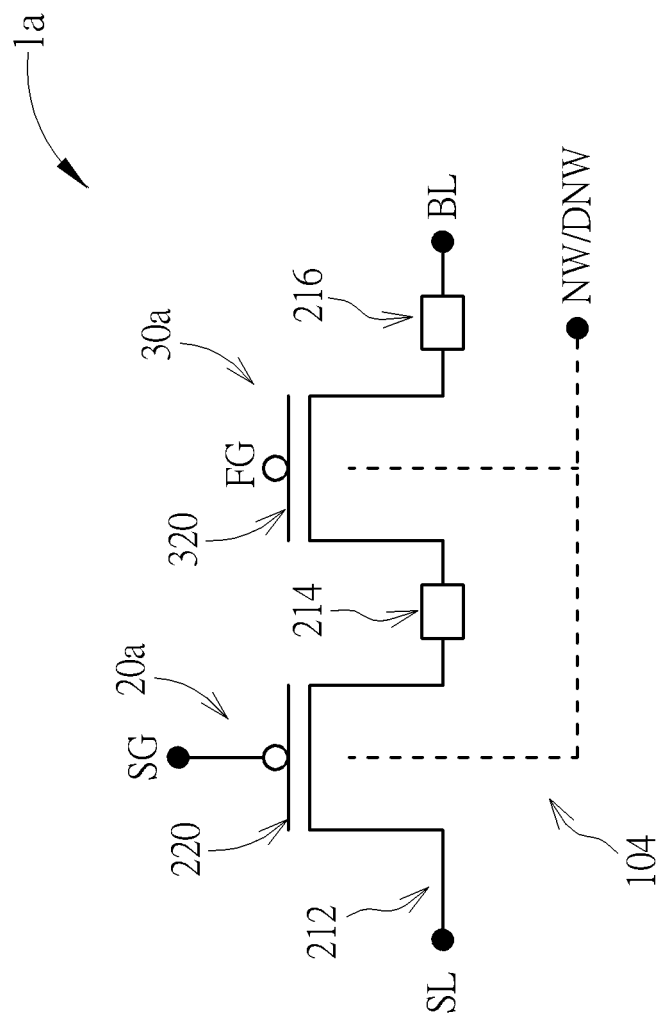

FIGS. 5A and 5B illustrate the equivalent circuit and exemplary conditions for programming (PGM), reading (READ) or erasing (ERS) operations of the memory cell unit as set forth in FIG. 3. As shown in FIGS. 4A and 4B, during PGM operation, the substrate (P-Sub) 100, the N type region 104, and the source line (SL) coupled to the P+ source region 212 are grounded, the select gate (SG) 220 is applied with a select gate voltage ranging between −1~−5V, the bit line (BL) coupled to the P+ drain region 216 in the third OD region 10c is applied with a bit line voltage ranging between −3~−9V. During READ operation, the substrate (P-Sub) 100, the N type region 104, and the source line (SL) coupled to the P+ source region 212 are grounded, the select gate (SG) 220 is applied with a select gate voltage ranging between −1~−5V, the bit line (BL) coupled to the P+ drain region 216 in the third OD region 10c is applied with a bit line voltage ranging between −0.3~−3V. Moreover, the data written into the memory cell unit can be erased by UV irradiation. Alternative modes for PGM and READ are also illustrated in FIG. 5B.

Figure 6A:
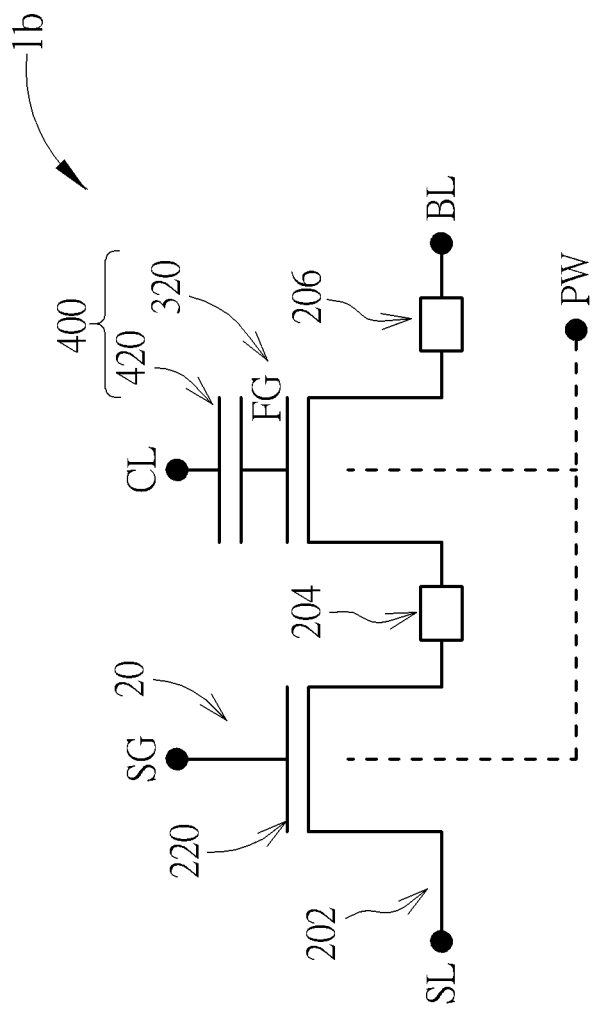
Figure 6B:
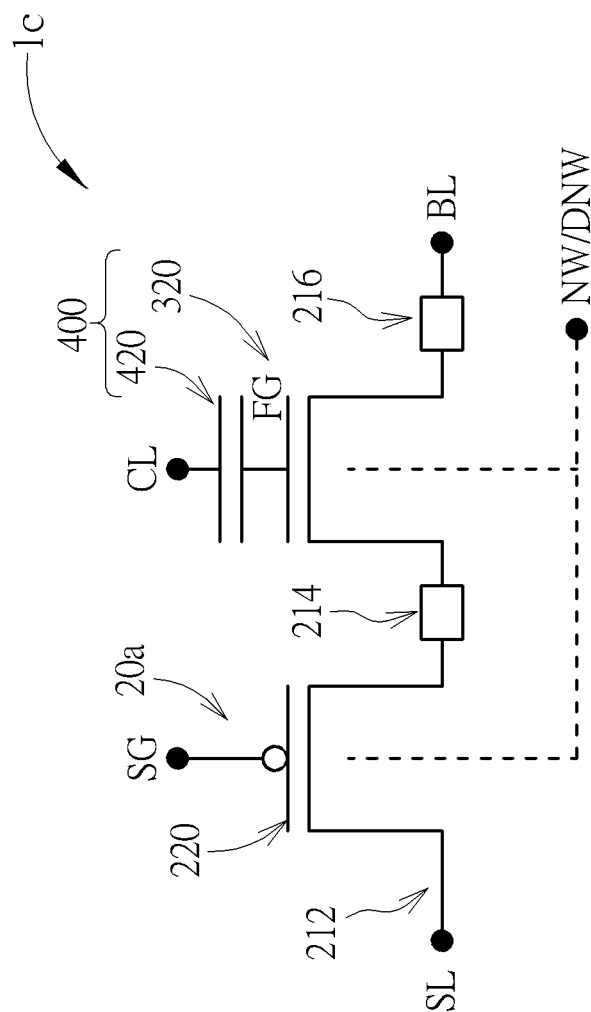

The present invention is also applicable to a double poly, nonvolatile memory cell scheme, wherein a control gate is stacked on the floating gate with a dielectric layer interposed therebetween. As shown in FIGS. 6A, 6B and 6C, the equivalent circuits and exemplary conditions for programming (PGM), reading (READ) or erasing (ERS) operations of a double poly memory cell unit are demonstrated. FIG. 6A shows an NMOS select transistor 20 coupled to a double poly structure 400 including a control gate 420 stacked on a floating gate 320. The layout of the double poly, nonvolatile memory cell unit 1b is similar to that as set forth in FIG. 2A, except for that an extra poly layer (control gate) is stacked on the floating gate 320. FIG. 6B shows a PMOS select transistor 20a coupled to a double poly structure 400 including a control gate 420 stacked on a floating gate 320. The sectional structure of the double poly, nonvolatile memory cell unit 1c is similar to that as set forth in FIG. 4, except for that an extra poly layer (control gate) is stacked on the floating gate 320. The control gate is coupled to a control line (CL). As shown in FIG. 6C, during PGM operation (with channel hot electron (CHE) mechanism), the N type region and the deep N type region are provided with a program voltage VPP (3V~20V), the source line (SL) is grounded, the select gate (SG) is applied with a supply voltage VDD2 (1V~10V), the bit line (BL) is applied with VPP. The P type region is grounded and the control line (CL) is applied with a supply voltage VDD2 (1V~10V). The data can be erased by UV irradiation. Another approach to programming the cell with Fowler-Nordheim (FN) tunneling mechanism is also illustrated in FIG. 6C.

The present invention is also applicable to multi-time programmable (MTP) memory schemes.

Figure 7A:
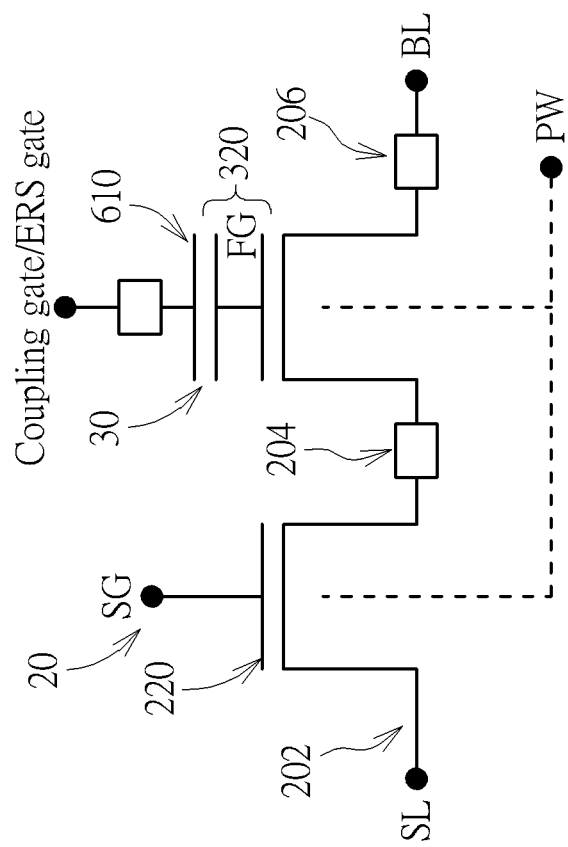
FIG. 7A illustrates the equivalent circuit of a MTP memory cell unit in accordance with another embodiment of this invention.
Figure 7B:
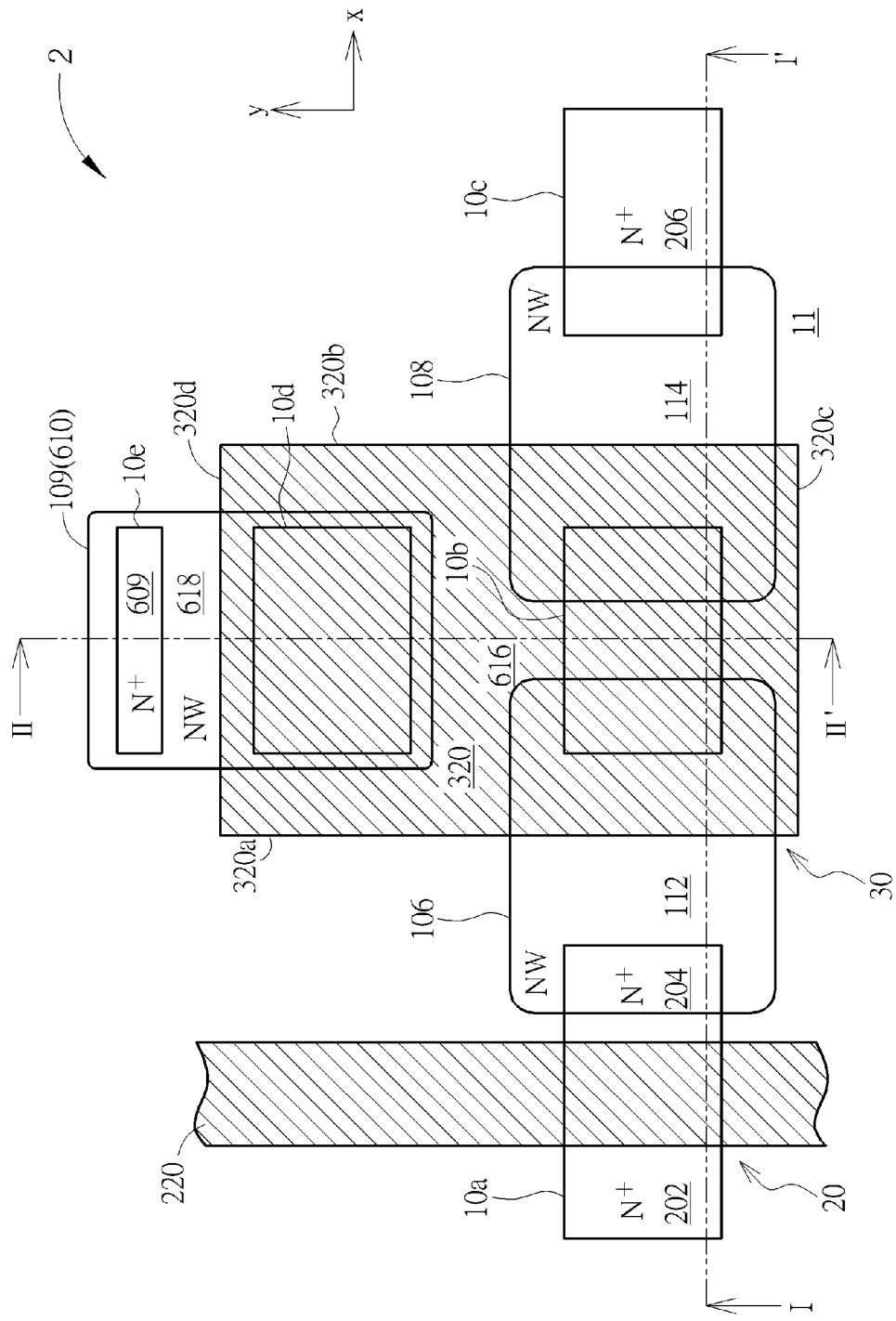
FIG. 7B is a schematic plan view of a layout structure of a MTP memory cell unit in accordance with one embodiment of this invention.
Figure 7C:
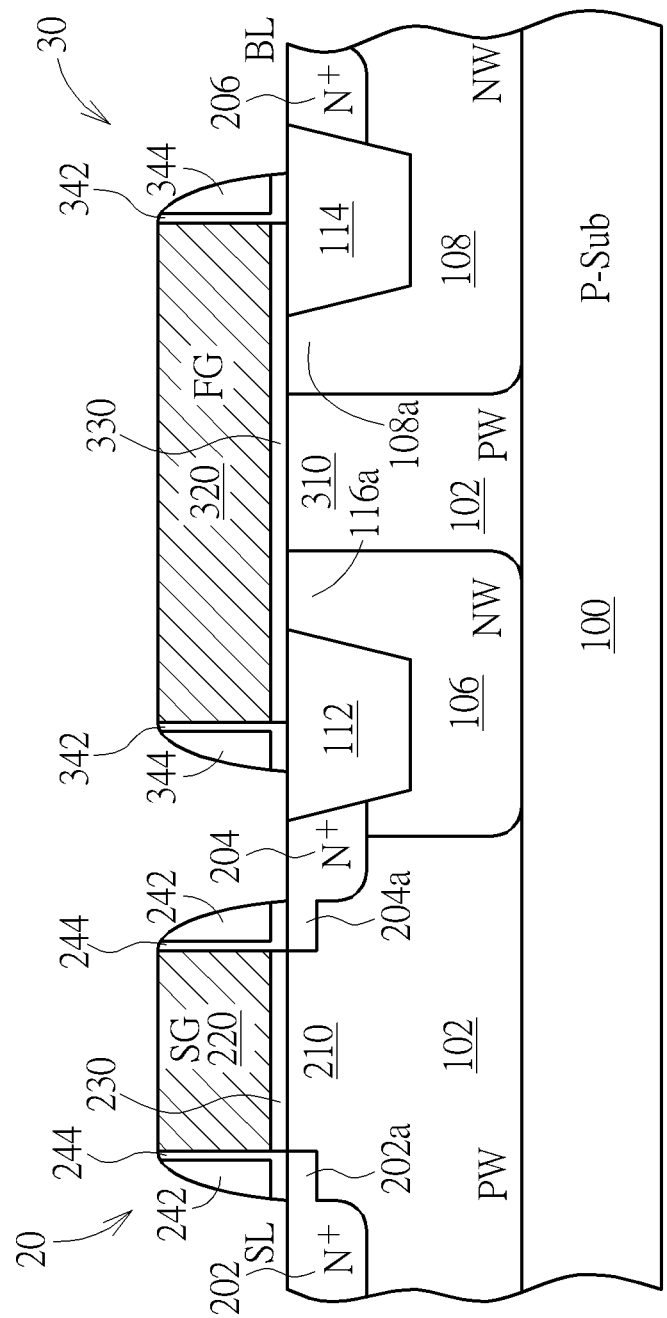
FIG. 7C is a schematic, cross-sectional diagram taken along line I-I' of FIG. 7B.
Figure 7D:
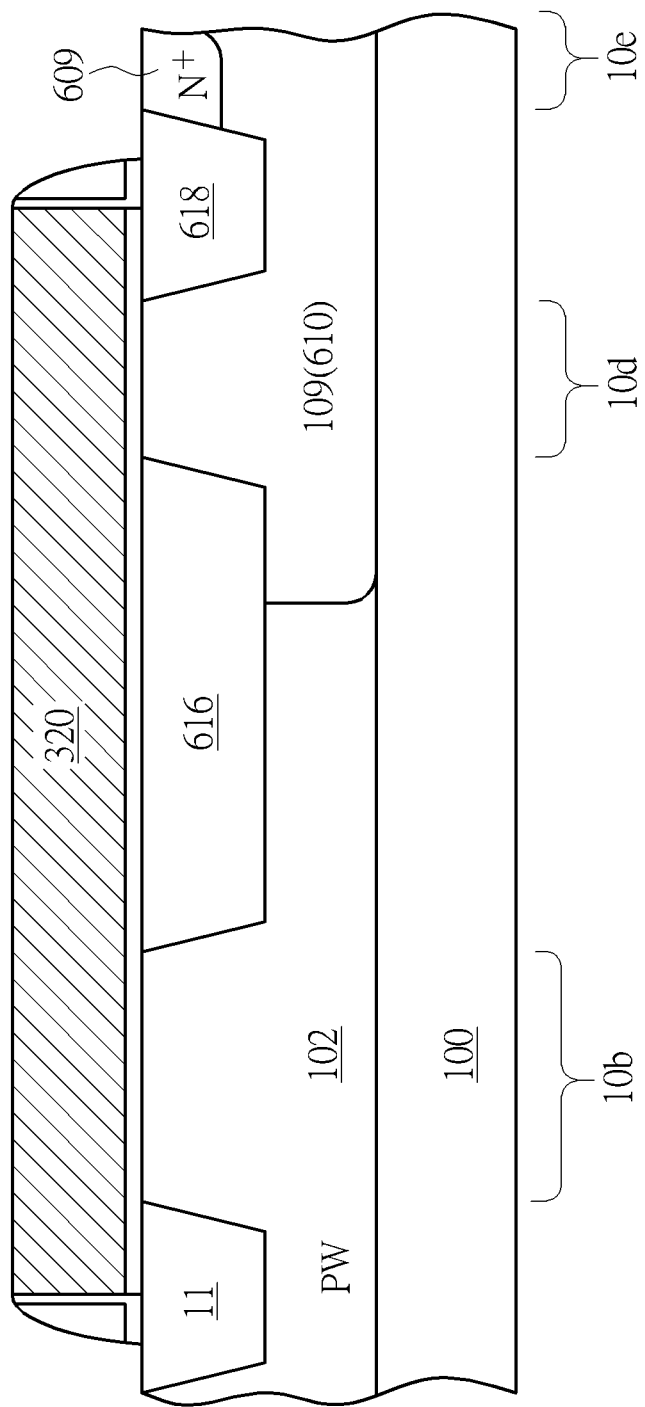
FIG. 7D is a schematic, cross-sectional diagram taken along line II-IF of FIG. 7B.

Please refer to FIGS. 7A~7D, wherein FIG. 7A illustrates the equivalent circuit of a MTP memory cell unit in accordance with another embodiment of this invention, FIG. 7B is a schematic plan view of a layout structure of a MTP memory cell unit in accordance with one embodiment of this invention, FIG. 7C is a schematic, cross-sectional diagram taken along line I-I' of FIG. 7B, and FIG. 7D is a schematic, cross-sectional diagram taken along line II-IF of FIG. 7B.

As shown in FIG. 7A, the MTP memory cell unit 2 has an equivalent circuit similar to the memory cell unit as set forth in FIG. 3B except for that the floating gate 320 is extended to capacitively couple to a coupling gate or erase gate 610.

Structurally speaking, as shown in FIGS. 7B~7D, likewise, the MTP memory cell unit 2 comprises three spaced-apart OD regions 10a, 10b and 10c arranged and aligned in a row along the first direction (reference x axis). The three spaced-apart OD regions: first OD region 10a, second OD region 10b, and third OD region 10c are separated by isolation region 11 embedded in a main surface of a semiconductor substrate 100 such as a P type doped silicon substrate. The MTP memory cell unit 2 may also comprise three spaced-apart OD regions: the second OD region 10b, the fourth OD region 10d, and the fifth OD region 10e arranged and aligned in a column along the second direction (reference y axis). According to the embodiment, the isolation region 11 may be fabricated concurrently with the logic circuit elements such as PMOS or NMOS transistors in the logic circuits. However, it is to be understood that the isolation region 11 can be fabricated separately from the logic circuit elements in some cases. The isolation region 11 includes a first intervening isolation region 112 between the first OD region 10a and the second OD region 10b, and a second intervening isolation region 114 between the second OD region 10b and the third OD region 10c. The isolation region 11 further includes a third intervening isolation region 616 between the second OD region 10b and the fourth OD region 10d, and a fourth intervening isolation region 618 between the fourth OD region 10d and the fifth OD region 10e.

A select gate transistor 20 may be formed directly on the first OD region 10a. The select gate transistor 20 may be an NMOS and comprises an N+ source region 202 (connected to a source line SL) in a P type region 102, an N+ drain region 204 spaced apart from the N+ source region 202, a channel region 210 near the main surface of the semiconductor substrate 100 between the N+ source region 202 and the N+ drain region 204, a select gate (SG) 220 overlying the channel region 210, and a gate dielectric layer 230 between the select gate 220 and the channel region 210. A pair of sidewall spacers 242 such as silicon nitride spacers may be provided on opposite sidewalls of the select gate 220. A liner layer 244 such as silicon oxide liner may be interposed between the sidewall spacer 242 and the sidewall of the select gate 220. Further, lightly doped drain (LDD) regions 202a and 204a may be provided in the P type region 102 and may be situated directly under the sidewall spacers 242. The straight line-shaped select gate extends along the second direction (reference y axis).

A floating gate transistor 30 is formed directly on the second OD region 10b. The floating gate transistor 30 is coupled to the select gate transistor 20 through the N+ drain region 204. That is, the N+ drain region 204 is commonly shared by the floating gate transistor 30 and the select gate transistor 20, thereby forming two serially connected transistors, and in this case, two serially connected NMOS transistors. The floating gate transistor 30 comprises a floating gate (FG) 320 overlying the second OD region 10b. The floating gate 320 extends along the second direction (reference y axis) to electrically couple to a third N type region 109, which may act as a coupling gate/erase gate 610, in the fourth OD region 10d. Likewise, the floating gate 320 may have a rectangular shape and may have four side edges 320a, 320b, 320c, and 320d. A sidewall spacer 344 and a liner layer 342 may be formed along the four side edges 320a, 320b, 320c, and 320d. The floating gate 320 is completely overlapped with the underlying second OD region 10b, the fourth OD region 10d and the third intervening isolation region 616, and is partially overlapped with the first, second and fourth intervening isolation regions 112, 114 and 618. The floating gate 320 laterally extends to the first and second intervening isolation regions 112 and 114 such that the two opposite side edges 320a and 320b of the floating gate 320 are situated directly on the first and second intervening isolation regions 112 and 114, respectively. The side edge 320d is directly situated on the fourth intervening isolation region 618. It is one germane feature of the invention that the perimeter of the floating gate 320 is located directly on the isolation region 11, and more importantly, the two opposite side edges 320a and 320b of the floating gate 320 are situated directly on the first and second intervening isolation regions 112 and 114, respectively. By doing this, the data retention loss or current leakage from the floating gate can be greatly reduced.

As shown in FIG. 7C, likewise, the first N type region 106 is formed in the semiconductor substrate 100. The first N type region 106 encompasses the first intervening isolation region 112. The floating gate transistor 30 is coupled to the N+ drain region 204 of the select gate transistor 20 through the first N type region 106 that partially overlaps with the floating gate 320 in the second OD region 10b and partially overlaps with the N+ drain region 204 in the first OD region 10a. The overlapping region between the first N type region 106 and the floating gate 320 is denoted as region 106a. Likewise, a second N type region 108 is formed in the semiconductor substrate 100 to encompass the second intervening isolation region 114. The floating gate transistor 30 is coupled to an N+ drain region 206 in the third OD region 10c through the second N type region 108 that partially overlaps with the floating gate 320 in the second OD region 10b and partially overlaps with the N+ drain region 206 in the third OD region 10c. The overlapping region between the second N type region 108 and the floating gate 320 is denoted as region 108a. According to the embodiment, the N+ drain region 206 is electrically coupled to a bit line (BL, not explicitly shown). A floating gate channel 310 may be defined between the overlapping regions 106a and 108a. No N+ doping regions or LDD regions are formed in the P type region 102 directly under the floating gate 320.

As shown in FIG. 7D, the two opposite side edges 320c and 320d are situated directly on the isolation region 11 and the fourth intervening isolation region 618, respectively. The third N type region 109 encompasses the fourth intervening isolation region 618. A pick-up N+ drain region 609 is provided in the fifth OD region 10e. It is to be understood that the conductivity types of the MTP memory cell unit 2 may be changed. For example, two serially connected PMOS transistors may be applicable without departing from the spirit of the invention. In a PMOS case, a deep N type region 101 may be added in the substrate 100 as described in FIG. 4.

It is advantageous to use the present invention because the data retention characteristics can be improved by avoiding the overlapping between the two opposite side edges 320a and 320b with any oxide define region of the memory cell unit.

Figure 8A:
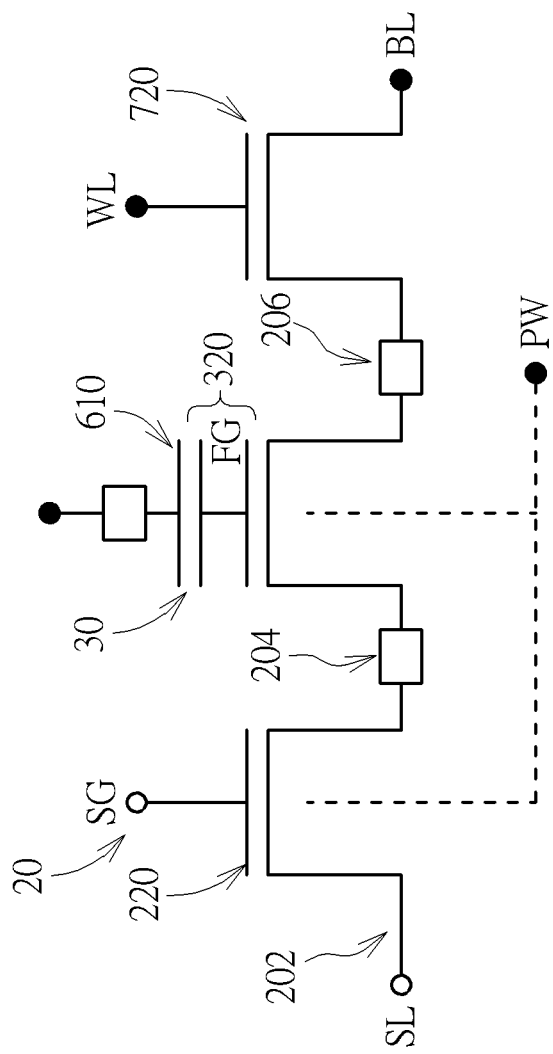
FIGS. 8A and 8B are variants embodiments.
Figure 8B:
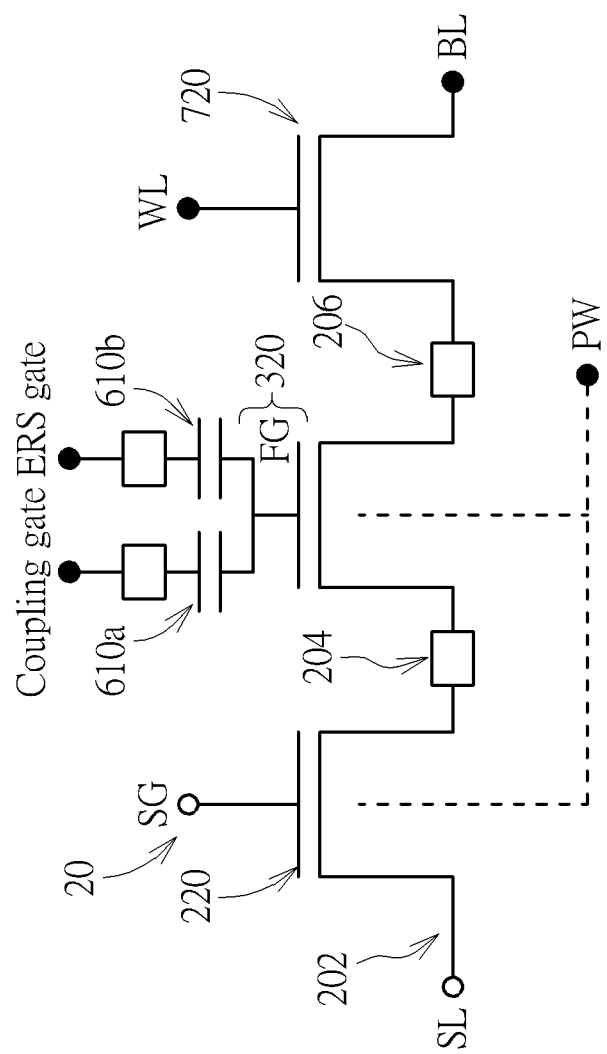

FIGS. 8A and 8B are variants embodiments. In FIG. 8A, an additional transistor 720 is serially coupled to the N+ drain region 206 and a source/drain of the transistor 720 is coupled to the bit line (BL). In FIG. 8B, the floating gate 320 is separately coupled to a coupling gate 610a and an erase gate 610b.

Figure 9A:
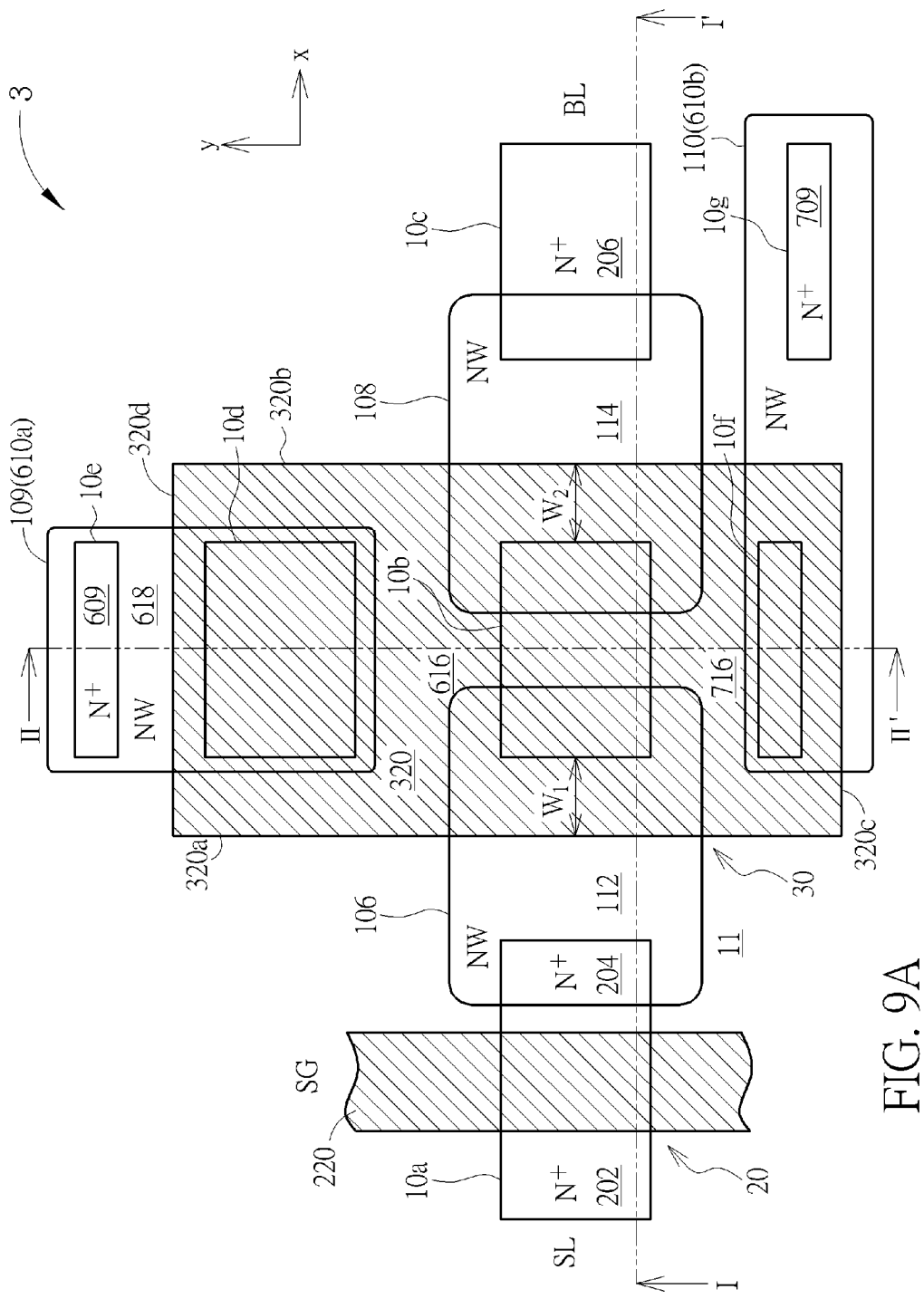
FIG. 9A is a plan view of a layout structure corresponding to the embodiment of FIG. 8B.
Figure 9B:
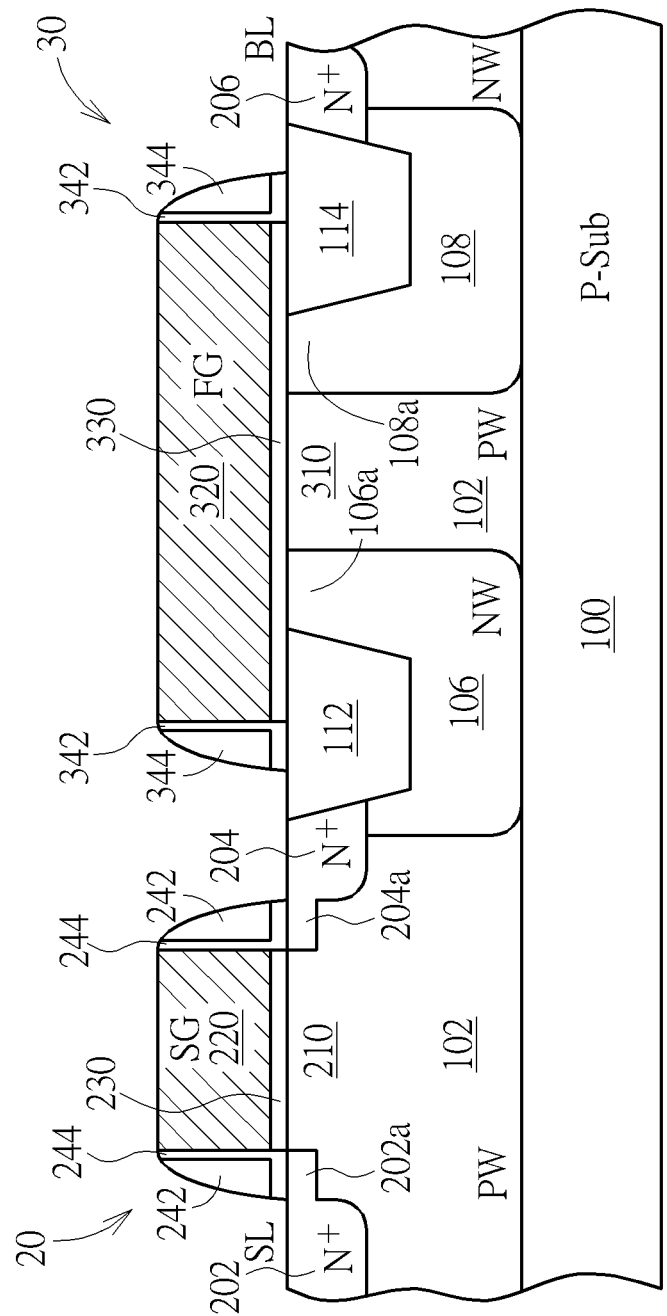
FIGS. 9B and 9C are cross-sectional diagrams taken along line I-I' and II-II' of FIG. 9A, respectively.
Figure 9C:
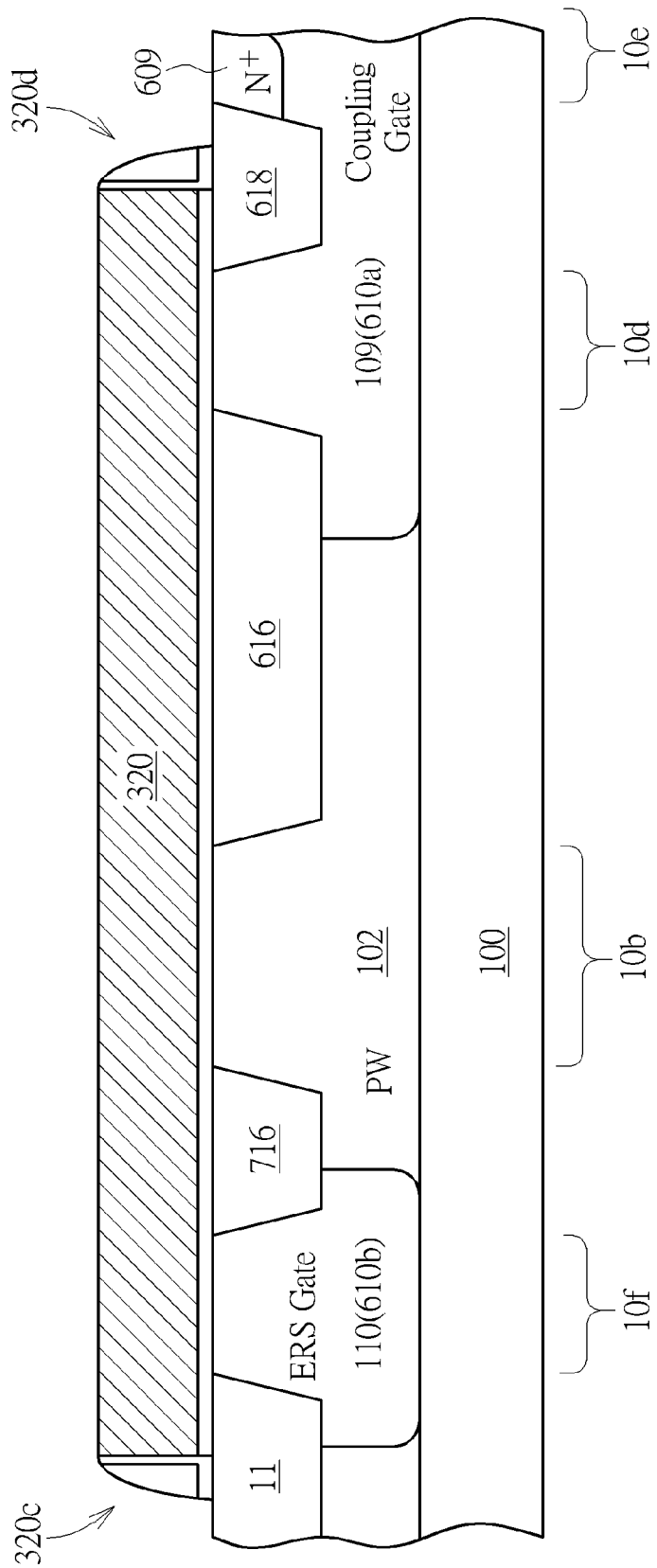

FIGS. 9A~9C are schematic diagrams corresponding to the MTP memory cell unit set forth in FIG. 8B, wherein FIG. 9A is a plan view of a layout structure, FIGS. 9B and 9C are cross-sectional diagrams taken along line I-I' and II-IF of FIG. 9A, respectively.

As shown in FIG. 9A, the MTP memory cell unit 3 has a similar structure to the memory cell unit as set forth in FIG. 6B except for that the floating gate 320 is extended on the its end to capacitively couple to a coupling gate 610a, and on the other end capacitively couple to an erase gate 610b along the lengthwise direction of the rectangular shaped floating gate 320.

As shown in FIGS. 9A~9C, likewise, the MTP memory cell unit 3 comprises three spaced-apart OD regions 10a, 10b and 10c in a row along the first direction (reference x axis). The three spaced-apart OD regions: first OD region 10a, second OD region 10b, and third OD region 10c are separated by isolation region 11 embedded in a main surface of a semiconductor substrate 100 such as a P type doped silicon substrate. The MTP memory cell unit 3 may also comprise four spaced-apart OD regions: the second OD region 10b, the fourth OD region 10d, the fifth OD region 10e, and the sixth OD region 10f in a column along the second direction (reference y axis). The isolation region 11 further includes a first intervening isolation region 112 between the first OD region 10a and the second OD region 10b, and a second intervening isolation region 114 between the second OD region 10b and the third OD region 10c. The isolation region 11 further includes a third intervening isolation region 616 between the second OD region 10b and the fourth OD region 10d, and a fourth intervening isolation region 618 between the fourth OD region 10d and the fifth OD region 10e. The isolation region 11 further includes a fifth intervening isolation region 716 between the second OD region 10b and the sixth OD region 10f.

A select gate transistor 20 may be formed directly on the first OD region 10a. The select gate transistor 20 may be an NMOS and comprises an N+ source region 202 (coupled to a source line SL) in a P type region 102, an N+ drain region 204 spaced apart from the N+ source region 202, a channel region 210 near the main surface of the semiconductor substrate 100 between the N+ source region 202 and the N+ drain region 204, a select gate (SG) 220 overlying the channel region 210, and a gate dielectric layer 230 between the select gate 220 and the channel region 210. A pair of sidewall spacers 242 such as silicon nitride spacers may be provided on opposite sidewalls of the select gate 220. A liner layer 244 such as silicon oxide liner may be interposed between the sidewall spacer 242 and the sidewall of the select gate 220. Further, lightly doped drain (LDD) regions 202a and 204a may be provided in the P type region 102 and may be situated directly under the sidewall spacers 242. The straight line-shaped select gate extends along the second direction (reference y axis).

A floating gate transistor 30 is formed directly on the second OD region 10b. The floating gate transistor 30 is coupled to the select gate transistor 20 through the N+ drain region 204. That is, the N+ drain region 204 is commonly shared by the floating gate transistor 30 and the select gate transistor 20, thereby forming two serially connected transistors, and in this case, two serially connected NMOS transistors. The floating gate transistor 30 comprises a floating gate (FG) 320 overlying the second OD region 10b. The floating gate 320 extends along the second direction (reference y axis) to electrically couple to a third N type region 109, which may act as a coupling gate 610a, in the fourth OD region 10d. The floating gate 320 further extends in an opposite direction to electrically couple to a fourth N type region 110, which may act as an erase gate 610b, in the sixth OD region 10f. The floating gate 320 may have a rectangular shape and may have four side edges 320a, 320b, 320c, and 320d. A sidewall spacer 344 and a liner layer 342 may be formed along the four side edges 320a, 320b, 320c, and 320d. The floating gate 320 is completely overlapped with the underlying second OD region 10b, the fourth OD region 10d, the six OD region, the third intervening isolation region 616 and the fifth intervening isolation region 716, and is partially overlapped with the first, second and fourth intervening isolation regions 112, 114 and 618. The floating gate 320 laterally extends to the first and second intervening isolation regions 112 and 114 such that the two opposite side edges 320a and 320b of the floating gate 320 are situated directly on the first and second intervening isolation regions 112 and 114, respectively. The side edge 320d is directly situated on the fourth intervening isolation region 618. It is one germane feature of the invention that the perimeter of the floating gate 320 is located directly on the isolation region 11, and more importantly, the two opposite side edges 320a and 320b of the floating gate 320 are situated directly on the first and second intervening isolation regions 112 and 114, respectively. By doing this, the data retention loss or current leakage from the floating gate can be greatly reduced.

As shown in FIG. 9B, likewise, the first N type region 106 is formed in the semiconductor substrate 100. The first N type region 106 encompasses the first intervening isolation region 112. The floating gate transistor 30 is coupled to the N+ drain region 204 of the select gate transistor 20 through the first N type region 106 that partially overlaps with the floating gate 320 in the second OD region 10b and partially overlaps with the N+ drain region 204 in the first OD region 10a. The overlapping region between the first N type region 106 and the floating gate 320 is denoted as region 106a. Likewise, a second N type region 108 is formed in the semiconductor substrate 100 to encompass the second intervening isolation region 114. The floating gate transistor 30 is coupled to an N+ drain region 206 in the third OD region 10c through the second N type region 108 that partially overlaps with the floating gate 320 in the second OD region 10b and partially overlaps with the N+ drain region 206 in the third OD region 10c. The overlapping region between the second N type region 108 and the floating gate 320 is denoted as region 108a. According to the embodiment, the N+ drain region 206 is electrically coupled to a bit line (BL, not explicitly shown). A floating gate channel 310 may be defined between the overlapping regions 106a and 108a. No N+ doping regions or LDD or source/drain (S/D) regions are formed in the P type region 102 directly under the floating gate 320 because the LDD implant or source/drain implant is blocked by the floating gate 320 and the STI region. This also improves the data retention.

As shown in FIG. 9C, the two opposite side edges 320c and 320d are situated directly on the isolation region 11 and the fourth intervening isolation region 618, respectively. The third N type region 109 encompasses the fourth intervening isolation region 618. A pick-up N+ drain region 609 is provided in the fifth OD region 10e. A pick-up N+ drain region 609 is provided in the fifth OD region 10e. Further, a pick-up N+ drain region 709 for the N type region 110 may be provided in the seventh OD region 10g that is situated adjacent to the sixth OD region 10f. The pick-up N+ drain region 709 can be seen in FIG. 9A.

It is to be understood that the conductivity types of the MTP memory cell unit 3 may be changed. For example, two serially connected PMOS transistors may be applicable without departing from the spirit of the invention. In a PMOS case, a deep N type region 101 may be added in the substrate 100 as described in FIG. 4.

It is advantageous to use the present invention because the data retention characteristics can be improved by avoiding the overlapping between the two opposite side edges 320a and 320b with any oxide define region of the memory cell unit.

Moreover, the present invention provides a nonvolatile memory structure having an ultrathin gate dielectric layer with thickness less than 70 nm. It is suitable for applied to the sub-micron process technology because it efficiently prevent from gate leakage currents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory structure, comprising:
a semiconductor substrate of a first conductivity type having thereon a first oxide define (OD) region, a second OD region and a third OD region arranged in a row along a first direction, wherein the first, second, and third OD regions are separated from one another by an isolation region, and wherein the isolation region comprises a first intervening isolation region between the first OD region and the second OD region, and a second intervening isolation region between the second OD region and the third OD region;
a select gate transistor on the first OD region, wherein the select gate transistor comprises a select gate extending along a second direction; and
a floating gate transistor on the second OD region, the floating gate transistor comprising a first well of the second conductivity type that partially overlaps with the floating gate in the second OD region, wherein the first well encompasses the first intervening isolation region, wherein the floating gate transistor is serially coupled to the select gate transistor through the first well, and wherein the floating gate transistor comprises a floating gate that is completely overlapped with the underlying second OD region and is partially overlapped with the first and second intervening isolation regions, wherein the first well partially overlaps with the drain region in the first OD region, wherein a second well of the second conductivity type is provided in the semiconductor substrate, and wherein the second well encompasses the second intervening isolation region, wherein the first conductivity type is P type, the second conductivity type is P type, and the third conductivity type is N type, and wherein a deep N type region is provided in the semiconductor substrate to isolate the first and second wells of the second conductivity type.

2. The nonvolatile memory structure according to claim 1 wherein the select gate transistor further comprises a source region of a second conductivity type in an ion well of a third conductivity type, an drain region of the second conductivity type spaced apart from the source region, a channel region between the source region and the drain region, the select gate overlying the channel region, and a gate dielectric layer between the select gate and the channel region.

3. The nonvolatile memory structure according to claim 2 wherein the source region is coupled to a source line.

4. The nonvolatile memory structure according to claim 2 wherein the floating gate transistor is serially coupled to the select gate transistor through the drain region.

5. The nonvolatile memory structure according to claim 2 wherein the select gate transistor further comprises a pair of sidewall spacers on opposite sidewalls of the select gate.

6. The nonvolatile memory structure according to claim 5 wherein the select gate transistor further comprises a lightly doped drain (LDD) region in the ion well and directly under each of the sidewall spacers.

7. The nonvolatile memory structure according to claim 6 wherein no LDD region or source/drain region is formed in the second OD region.

8. The nonvolatile memory structure according to claim 1 wherein an entire perimeter of the floating gate is located directly on the isolation region.

9. The nonvolatile memory structure according to claim 1 wherein the first direction is substantially perpendicular to the second direction.

10. The nonvolatile memory structure according to claim 1 wherein the floating gate transistor is coupled to a drain region in the third OD region through the second well that partially overlaps with the floating gate in the second OD region and partially overlaps with the drain region in the third OD region.

11. The nonvolatile memory structure according to claim 1 further comprising a control gate stacked on the floating gate.

12. The nonvolatile memory structure according to claim 2 wherein the first conductivity type is P type, the second conductivity type is N type, and the third conductivity type is P type.

13. A nonvolatile memory structure, comprising:
a semiconductor substrate of a first conductivity type having thereon a first oxide define (OD) region, a second OD region, a third OD region, a fourth OD region and a fifth OD region, wherein the first OD region, the second OD region, and the third OD region are arranged in a row along a first direction, while the second OD region, the fourth OD region, and the fifth OD region are arranged in a column along a second direction, wherein the first, second, and third OD regions are separated from one another by an isolation region, and wherein the isolation region comprises a first intervening isolation region between the first OD region and the second OD region, a second intervening isolation region between the second OD region and the third OD region, a third intervening isolation region between the second OD region and the fourth OD region, and a fourth intervening isolation region between the fourth OD region and the fifth OD region;
a select gate transistor on the first OD region, wherein the select gate transistor comprises a select gate extending along the second direction; and
a floating gate transistor on the second OD region, the floating gate transistor comprising a first well of the second conductivity type that partially overlaps with the floating gate in the second OD region, wherein the first well encompasses the first intervening isolation region, wherein the floating gate transistor is serially coupled to the select gate transistor through the first well, and wherein the floating gate transistor comprises a floating gate that is completely overlapped with the underlying second OD region, the fourth OD region and the third intervening isolation region, and is partially overlapped with the first and second intervening isolation regions, wherein the first well partially overlaps with the drain region in the first OD region, wherein a second well of the second conductivity type is provided in the semiconductor substrate, and wherein the second well encompasses the second intervening isolation region, wherein the first conductivity type is P type, the second conductivity type is P type, and the third conductivity type is N type, and wherein a deep N type region is provided in the semiconductor substrate to isolate the first and second wells of the second conductivity type.

14. The nonvolatile memory structure according to claim 13 wherein the select gate transistor further comprises a source region of a second conductivity type in an ion well of a third conductivity type, an drain region of the second conductivity type spaced apart from the source region, a channel region between the source region and the drain region, the select gate overlying the channel region, and a gate dielectric layer between the select gate and the channel region.

15. The nonvolatile memory structure according to claim 14 wherein the source region is coupled to a source line.

16. The nonvolatile memory structure according to claim 14 wherein the floating gate transistor is serially coupled to the select gate transistor through the drain region.

17. The nonvolatile memory structure according to claim 14 wherein the select gate transistor further comprises a pair of sidewall spacers on opposite sidewalls of the select gate.

18. The nonvolatile memory structure according to claim 17 wherein the select gate transistor further comprises a lightly doped drain (LDD) region in the ion well and directly under each of the sidewall spacers.

19. The nonvolatile memory structure according to claim 18 wherein no LDD region or source/drain region is formed in the second OD region.

20. The nonvolatile memory structure according to claim 14 wherein an entire perimeter of the floating gate is located directly on the isolation region.

21. The nonvolatile memory structure according to claim 13 wherein the first direction is substantially perpendicular to the second direction.

22. The nonvolatile memory structure according to claim 13 wherein the floating gate transistor is coupled to a drain region in the third OD region through the second well that partially overlaps with the floating gate in the second OD region and partially overlaps with the drain region in the third OD region.

23. The nonvolatile memory structure according to claim 22 wherein the drain region in the third OD region is coupled to a bit line.

24. The nonvolatile memory structure according to claim 14 wherein the first conductivity type is P type, the second conductivity type is N type, and the third conductivity type is P type.

25. The nonvolatile memory structure according to claim 13 wherein the floating gate is extended to capacitively coupled to an ion well of the second conductivity type in the fourth OD region.

26. The nonvolatile memory structure according to claim 25 wherein the ion well of the second conductivity type in the fourth OD region is a coupling gate.

27. The nonvolatile memory structure according to claim 25 wherein the ion well of the second conductivity type in the fourth OD region is an erase gate.

* * * * *